DIGITAL INTEGRATOR-SYNCHRONIZER HAVING LOW NOISE SUSCEPTIBILITY

Filed Sept. 11, 1968 3 Sheets-Sheet 1

INVENTORS
ROBERT L. JAMES
DONALD P. VARGO

BY Anthony J. [signature]
ATTORNEY

INVENTORS
ROBERT L. JAMES
DONALD P. VARGO
BY
ATTORNEY

DIGITAL INTEGRATOR-SYNCHRONIZER HAVING LOW NOISE SUSCEPTIBILITY

Filed Sept. 11, 1968

INVENTORS
ROBERT L. JAMES
DONALD P. VARGO
BY
[signature]
ATTORNEY 3,550,018

DIGITAL INTEGRATOR-SYNCHRONIZER HAVING LOW NOISE SUSCEPTIBILITY

Robert L. James, Bloomfield, and Donald P. Vargo, Nutley, N.J., assignors to The Bendix Corporation, a corporation of Delaware Filed Sept. 11, 1968, Ser. No. 759,181
Int. Cl. G06g 7/18
U.S. Cl. 328—127 8 Claims

ABSTRACT OF THE DISCLOSURE

A digital integrator-synchronizer including a voltage to frequency converter for providing pulses at a frequency corresponding to the amplitude of an input signal and a counter controlled by a count-up/count-down command generator for providing a digital signal corresponding to the total number of pulses. A converter converts the digital signal to analog output signal corresponding to the integral of the input signal and the analog output signal is compared with the input signal to provide a synchronized signal. The voltage to frequency converter, the counter and the command generator are disabled when the device is not processing the input signal, thereby preventing response to external stimuli including electromagnetic noise.

BACKGROUND OF THE INVENTION

Field of the invention

This invention relates to an integrator-synchronizer system and, particularly, to a digital integrator-synchronizer including means for reducing noise susceptibility to an insignificantly low level. More particularly, this invention relates to means for reducing noise susceptibility by inhibiting system response to external stimuli when the system is not actually integrating or synchronizing an input signal.

Description of the prior art

Prior to the present invention digital integrator-synchronizer systems were particularly prone to errors caused by electromagnetic interference (EMI).

The present invention overcomes this disadvantage by disabling the system when it is not actually called upon to process an input signal. Since the disabled time is a major portion of system operating time, particularly when the system is operating as a synchronizer and holding a constant output for infinite memory, the chances for errors due to electromagnetic interference are greatly reduced.

SUMMARY OF THE INVENTION

This invention contemplates an integrator-synchronizer system including a voltage to frequency converter responsive to an input signal for providing pulses at a frequency corresponding to the amplitude of the input signal. A counter counts the pulses in accordance with a command from a count-up/count-down command generator for providing a digital signal corresponding to the total number of pulses, and a converter converts the digital signal to an analog output signal. When the input signal is below a predetermined level a signal level detector disables the voltage to frequency converter, the counter and the up-down command generator thereby reducing errors in the analog output signal due to system response to external stimuli.

One object of this invention is to provide digital means having reduced susceptibility to external stimuli including electromagnetic interference for integrating or synchronizing an input signal.

Another object of this invention is to include in the type of device described means for disability the device when the input signal is below a predetermined threshold.

Another object of this invention is to include in the type of device described means for preventing the device from responding to external stimuli when the device is not actually processing the input signal.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
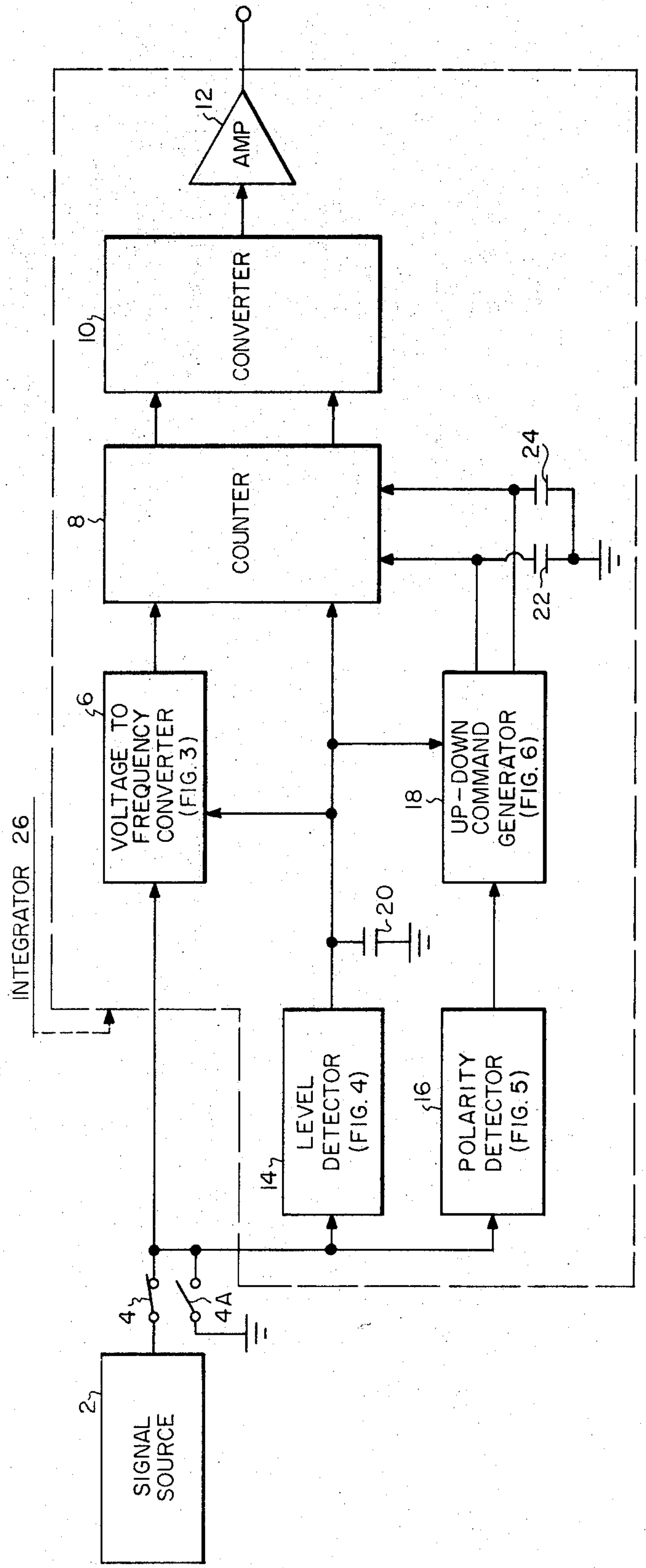
FIG. 1 is a block diagram showing the device of the present invention in integrator configuration.

With reference to FIG. 1, there is shown an integrator designated generally by the numeral 26 and including a voltage to frequency converter 6, a counter 8, a digital to analog converter 10, an output amplifier 12, a signal level detector 14, a polarity detector 16 and a count-up/count-down command generator 18.

A signal source 2 provides a direct current or demodulated alternating current input signal such as may be used in a flight control system or other servo system, and which signal is applied through a manually or automatically operated normally closed switch 4 to voltage to frequency converter 6. Voltage to frequency converter 6 provides pulses at a frequency corresponding to the amplitude of the input signal from signal source 2, and which pulses are applied to counter 8. Counter 8 counts the total number of pulses and provides a digital signal corresponding thereto, and which digital signal is applied to digital-to-analog converter 10 for providing an analog signal in response to the digital signals. The output from converter 10 is applied to output amplifier 12 for providing an analog output signal corresponding to the integral of the signal from signal source 2.

The input signal from signal source 2 is applied to level detector 14, and when the input signal is below a predetermined threshold, lever detector 14 provides an inhibiting signal which is applied to voltage to frequency converter 6, counter 8 and count-up/count-down command generator 18 for disabling the voltage to frequency converter, the counter and the command generator as will hereinafter be explained.

The signal from signal source 2 is applied to polarity detector 16, and which polarity detector 16 provides a controlling output which is applied to command generator 18 for controlling command generator to provide a count-up or count-down command pulse in accordance with the polarity of the signal from signal source 2. The command pulse is applied to counter 8 for controlling the counting direction of the counter.

A capacitor 20 is connected to an output of level detector 14, and capacitors 22 and 24 are connected to outputs of command generator 18. The purpose of capacitors 20, 22 and 24 is to filter extraneous noise from the circuit as will hereinafter become evident to those skilled in the art.

Figure 2:
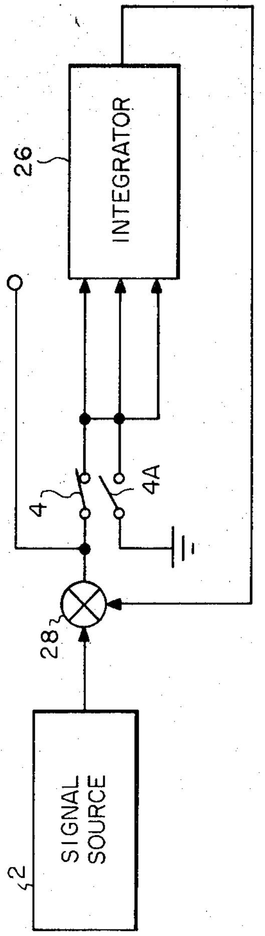
FIG. 2 is a block diagram showing the device of the present invention in synchronizer configuration.

With reference to FIG. 2, when the device of the present invention is connected in synchronizer configuration, the analog output from integrator 26 and the input signal from signal source 2 are applied to a summing means 28. Summing means 28 sums the applied signals in a sense so that the analog output signal washes out the input signal, with summing means 28 providing a synchronizing signal at its output.

Figure 3:
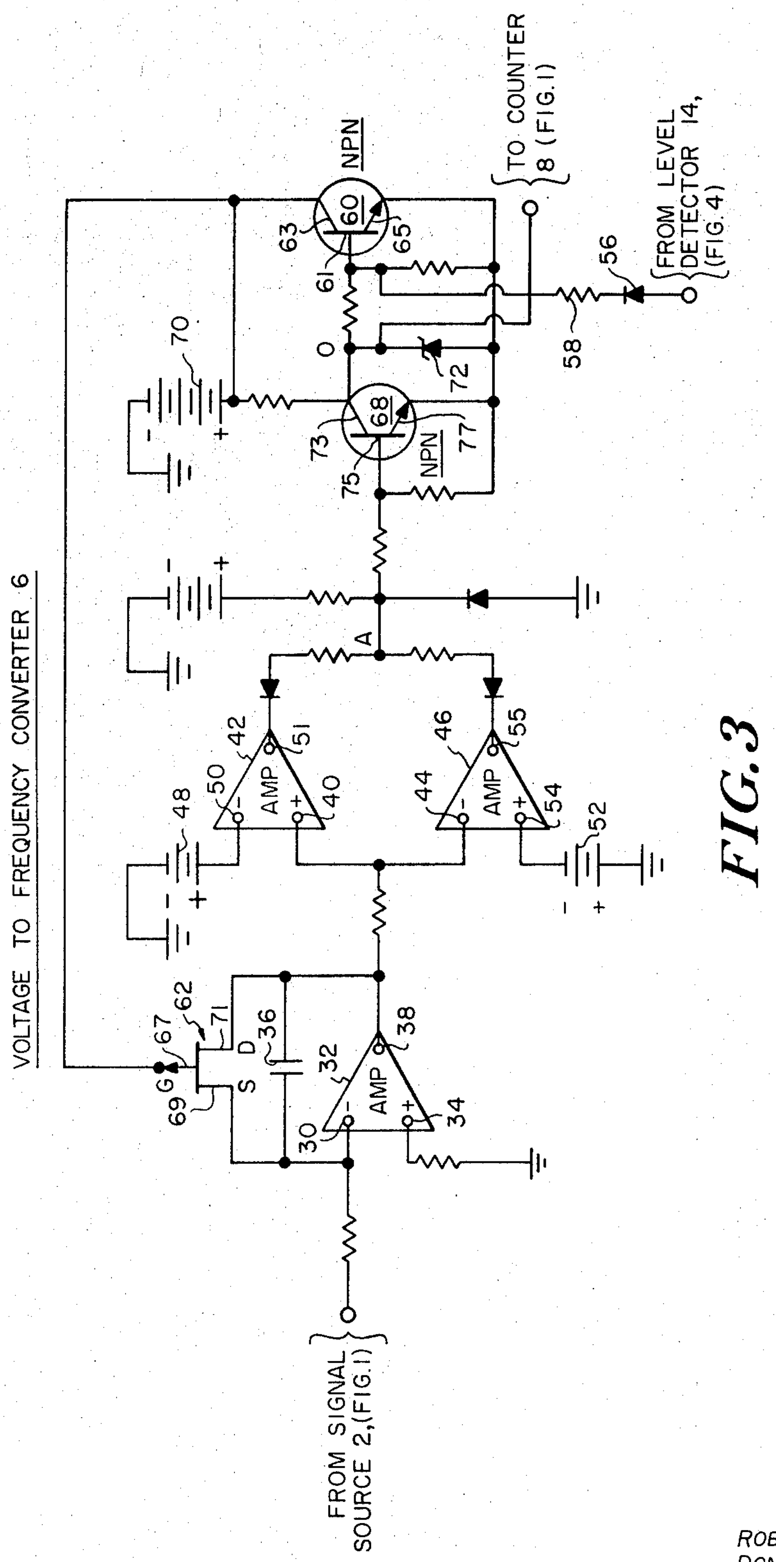
FIG. 3 is an electrical schematic diagram of a voltage to frequency converter 6 shown generally in the block diagram of FIG. 1.

With reference to FIG. 3, wherein voltage to frequency converter 6 shown generally in FIG. 1 is shown in substantial detail, the signal from signal source 2 is applied to an input terminal 30 of an amplifier 32, and which amplifier 32 has a grounded terminal 34 and an output terminal 38. A capacitor 36 is connected in feedback configuration to input terminal 30 and to output terminal 38 of amplifier 32. Output terminal 38 of amplifier 32 is connected to a non-inverting input terminal 40 of an operational amplifier 42, and which amplifier 42 has an inverting input terminal 50 and an output terminal 51. Output terminal 38 of amplifier 32 is connected to an inverting input terminal 44 of an amplifier 46, and which amplifier 46 has a non-inverting input terminal 54 and an output terminal 55. A source of positive direct current shown as a battery 48 providing, for example, a voltage at a level of +2 volts, is connected to inverting input 50 of amplifier 42 and a source of negative direct current shown as a battery 52 providing, for example, a voltage at a level of a −2 volts, is connected to non-inverting input 54 of amplifier 46.

The signal from level detector 14 is applied through a diode 56 and a resistor 58 to a base 61 of an NPN transistor 60 having a collector 63 and an emitter 65. Collector 63 of transistor 60 is connected to a gate element 67 of a field effect transistor 62 having a drain element 69 and a source element 71, and which transistor 62 is connected at said drain and source elements across capacitor 36.

A collector element 73 of an NPN transistor 68 having a base element 75 and an emitter element 77 is connected to a positive source of direct current shown as a battery 70 and providing, for example, a voltage at a level of +12 volts. Collector element 73 is connected to the base element 61 of transistor 60. A Zener diode 72 is connected across collector 73 and emitter 77 and across base 61 and emitter 65 of transistors 68 and 60, respectively. The output of voltage to frequency converter 6 is taken at a point 0 intermediate collector 73 of transistor 68 and base 61 of transistor 60.

The arrangement shown in FIG. 3 is such that capacitor 36 connected to amplifier 32 in integrator configuration charges to the direct current level of batteries 48 and 52 at a rate which is a function of the input signal from signal source 2 so that the voltage at a point A intermediate output terminals 51 and 55 of amplifiers 42 and 46, respectively, is at a low logic level, the voltage at output point 0 intermediate collector 73 of transistor 68 and base 61 of transistor 60 is at a high logic level and the voltage at collector 63 of transistor 60 is at a low logic level. Field effect transistor 62, connected at its gate element 67 to collector 63 of transistor 60 shorts out capacitor 36 causing the voltage at output terminal 38 of amplifier 32 to be zero. When this occurs, a switching action takes place so that the voltage at point A is at a high logic level, transistors 60 and 62 are rendered nonconductive and capacitor 36 charges to repeat the cycle whereby a pulse output is provided at point 0 at a frequency corresponding to the signal from signal source 2.

When the signal from signal source 2 shown in FIG. 1 is below a predetermined threshold, level detector 14 provides an output at a high logic level, and which high logic level output is applied to base 61 of transistor 60 through diode 56 and resistor 58 heretofore noted. This output drives transistor 60 to saturation which in turn clamps gate element 67 of field effect transistor 62 to ground causing transistor 62 to become conductive and remaining so until the signal from level detector 14 applied to the base of transistor 60 is removed. This action prevents the cyclic charging and discharging of capacitor 36 thereby preventing a pulse output from being provided by the voltage to frequency converter at point 0 when the signal from signal source 2 is below the predetermined threshold level.

The aforenoted condition occurs, for example, when then synchronizing operation has been performed, switch 4 shown in FIGS. 1 and 2 is open, switch 4A is closed and the device is in a hold mode having infinite memory. The input signal to voltage to frequency converter 6 is zero and the inhibiting effect occurs. In this connection it is to be noted that the inhibiting effect has a side advantage in that drift of amplifiers 42 and 44 with ambient temperature change, which might otherwise result in a pulse output from voltage to frequency converter 6 for a zero input signal, is effectively prevented. Further, capacitor 20 connected to the output of level detector 14 as shown in FIG. 1 filters any noise in the level detector output thereby preventing extraneous signals from removing the inhibiting effect.

Figure 4:
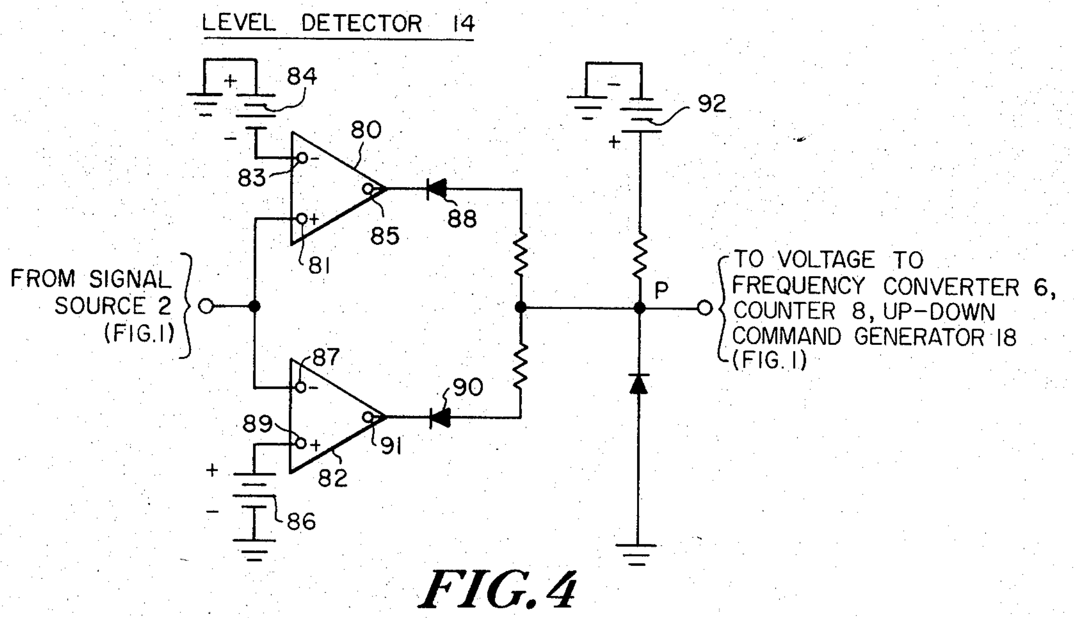
FIG. 4 is an electrical schematic diagram of a voltage level detector 14 shown generally in the block diagram of FIG. 1.

Level detector 14 shown generally in FIG. 1 is shown in substantial detail in FIG. 4. The input signal from signal source 2 is applied to a non-inverting input terminal 81 of an operational amplifier 80 having an inverting input terminal 83 and an output terminal 85, and is applied to an inverting input terminal 87 of an operational amplifier 82 having a non-inverting input terminal 89 and an output terminal 91. A source of negative direct current shown as a battery 84 providing a negative voltage at a predetermined threshold required for starting operation of the device is connected to inverting input 83 of amplifier 80 and a source of positive direct current shown as a battery 86 providing a positive voltage at the threshold level is connected to non-inverting input 89 of amplifier 82.

A diode 88 is connected to output terminal 85 of amplifier 80 and a diode 90 is connected to output terminal 91 of amplifier 82. A suitable source of positive direct current shown as a battery 92 providing, for example, a voltage at a level of +5 volts, is connected at a point P intermediate diodes 88 and 90, and at which point P level detector 14 provides the heretofore referred to inhibiting signal which is applied to voltage to frequency converter 6, counter 8, and up-down command generator 18 as shown in FIG. 1.

When the signal from signal source 2 is zero, i.e., when switch 4 is open, switch 4A is closed and the device is in the hold mode, amplifiers 80 and 82 are at positive saturation, diodes 88 and 90 are reverse biased and the output at point P is at a high logic level equal to the level of the voltage from battery 92. This high logic level output is applied to transistor 60 of voltage to frequency converter 6 to inhibit the voltage to frequency converter as heretofore explained with reference to FIG. 3.

When the signal from signal source 2 exceeds the threshold level provided by batteries 84 and 86 in either the positive or negative direction, either amplifier 80 or amplifier 82 will switch to negative saturation thereby forward biasing either diode 88 or diode 90 and causing the output of level detector 14 at point P to be at a low logic level. This output is applied to transistor 60 of voltage to frequency converter 6 enabling the voltage to frequency converter to provide the pulse output as heretofore shown with reference to FIG. 3.

Figure 5:
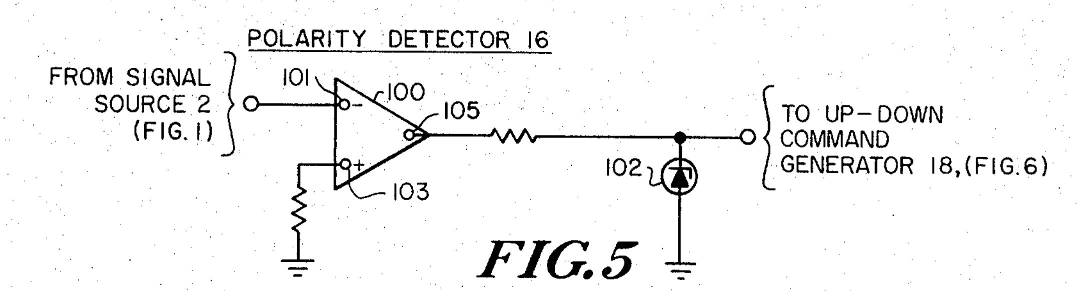
FIG. 5 is an electrical schematic diagram of a signal polarity detector 16 shown generally in the block diagram of FIG. 1.

With reference to FIG. 5, wherein polarity detector 16 shown generally in FIG. 1 is shown in substantial detail, the input signal from signal source 2 is applied to an inverting input terminal 101 of an operational amplifier 100, and which amplifier 100 has a grounded terminal 103 and an output terminal 105 connected to a Zener diode 102 having a predetermined breakdown voltage, which may be, for purposes of example, 5 volts. The arrangement is such that when the input signal from signal source 2 is positive, the output from polarity sensor 16, and which output is applied to up-down command generator 18 as shown in FIG. 1, is at zero, and when the input signal from signal source 2 is negative, the output of level detector 14 is at the 5 volt level of Zener diode 102.

Figure 6:
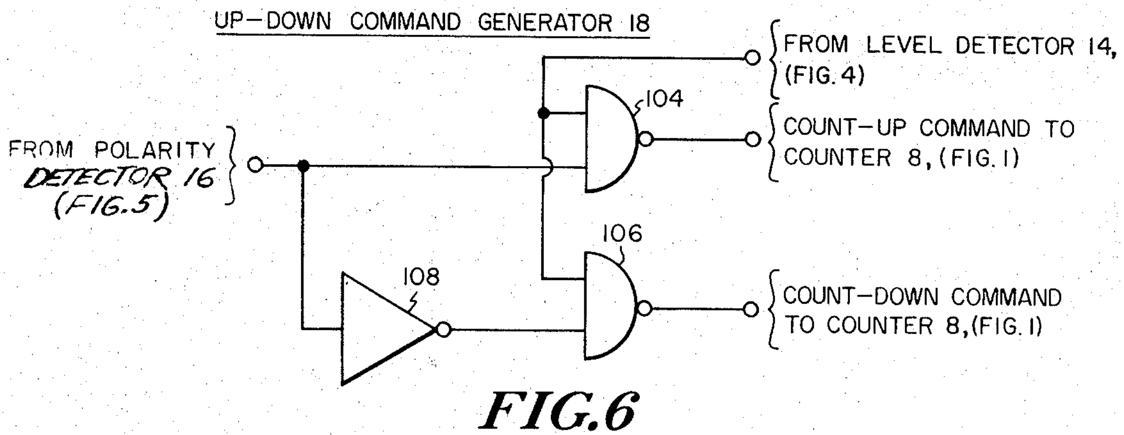
FIG. 6 is an electrical schematic diagram of a count-up/count-down command generator 18 shown generally in the block diagram of FIG. 1.

With reference to FIG. 6, up-down command generator 18 shown generally in FIG. 1 is shown in substantial detail and includes a gate 104 and a gate 106. The signal from polarity sensor 16 (low logic level for positive input signal and high logic level for negative input signal) is applied to gate 104 and is applied through an inverter 108 to gate 106. The output from level detector 14 (high logic level for inhibiting effect to occur) is applied to gate 104 and to gate 106. The arrangement is such that the high logic level signal from voltage level detector 14 causes a high logic level output at each of the gates 104 and 106 thereby simultaneously providing a count-up and count-down command to counter 8 to prevent any change in the output of the counter. In this connection it is to be noted that counter 8 is of the type having a plurality of stages, with each stage being a flip-flop circuit driven by the preceding stage. The count-up and count-down commands are simultaneously applied to the first stage of counter 8 for inhibiting operation of said first stage, and to the second stage of the counter for inhibiting operation of said second stage and thereby inhibiting all succeeding stages. A particular advantage results from the aforenoted configuration in that counter 10 can be designed or selected so that the inhibiting effect occurs at a low rather than high logic level to obviate sophisticated noise filtering equipment. Additional assurance against noise is provided by the capacitors 22 and 24 connected count-up/count-down as shown in FIG. 1.

It is seen from the aforegoing description of the invention that voltage to frequency converter 6, counter 8 and command generator 18 are inhibited from responding to external signals including undesirable electromagnetic interference when the equipment is not being called upon to actually integrate or synchronize the signal from signal source 2. Since the inhibited portions of time constitute the major portion of the operating time of the device, the chances for output errors due to external noise are greatly reduced.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. An electrical network, comprising:

means for providing an input signal;

a voltage to frequency converter connected to the input signal means for providing pulses at a frequency corresponding to the input signal amplitude;

a counter connected to the voltage to frequency converter and responsive to the pulses therefrom for providing a digital output corresponding to the total number of pulses;

a digital-to-analog converter connected to the counter for converting the digital output to an analog output;

an up-down command generator connected to the input signal means and connected to the counter and responsive to the input signal for controlling the counting direction of the counter; and disabling means connected to the input signal means, the voltage to frequency converter, the command generator and the counter, and responsive to an input signal below a predetermined limit for disabling the voltage to frequency converter, the command generator and the counter.

2. An electrical network as described by claim 1, including:

means connected to the input signal means and to the digital-to-analog converter for summing the input signal and the analog output in a sense so that the analog output washes out the input signal to provide a synchronized signal.

3. An electrical network as described by claim 1, including:

a polarity detector connected to the input signal means for providing a signal at one logic level when the input signal is of one polarity and for providing a signal at another logic level when the input signal is of the opposite polarity; and the up-down command generator connected to the polarity detector and responsive to the signal at one logic level for commanding the counter to count in one direction and responsive to the signal at the other logic level for commanding the counter to count in the opposite direction.

4. An electrical network as described by claim 1, wherein the voltage to frequency converter includes:

an operational amplifier connected to the means for providing an input signal;

means for providing a voltage at a predetermined level connected to the amplifier;

a capacitor connected in feedback relation to the amplifier and charging to the predetermined level as a function of the input signal;

a current flow control device connected across the capacitor;

means connected to the amplifier and to the current flow control device, and responsive to the amplifier output when the capacitor is charged to the predetermined level for rendering the current flow control device effective to discharge the capacitor; and means connected to the amplifier and responsive to the output therefrom when the capacitor charges and discharges to provide the pulses at a frequency corresponding to the amplitude of the input signal.

5. An electrical network as described by claim 4, including:

means connected to the disabling means and to the current flow control device and rendered effective by the disabling means when the input signal is below the predetermined limit for rendering the current flow control device ineffective to discharge the capacitor thereby preventing a pulse output from being provided by the last mentioned means so as to disable the voltage to frequency converter.

6. An electrical network as described by claim 1, wherein the disabling means includes:

amplifier means connected to the input signal means and saturated in one sense when the input signal exceeds a predetermined level and switching to saturation in another sense when the input signal is below the predetermined level;

means connected to the amplifier means for providing an output at one logic level when the amplifier means is saturated in the one sense and for providing an output at another logic level when the amplifier is saturated in the other sense; and said output at the other logic level being effective to disable the voltage to frequency converter, the command generator and the counter.

7. An electrical network as described by claim 3, wherein the polarity detector includes:

an amplifier having a grounded input terminal, another input terminal connected to the means for providing an input signal and a output terminal;

a current flow control device having a predetermined breakdown voltage connected to the output terminal; and the amplifier being responsive to the input signal for providing a signal at a low logic level at the output terminal thereof when the input signal is of one sense and for providing a signal at a high logic level when the input signal is of an opposite sense, with said high logic level corresponding to the breakdown voltage of the current flow device.

8. An electronic network as described by claim 1, wherein:

the command generator includes means affected by the disabling means when the input signal is below the predetermined limit for simultaneously providing a count-up and count-down command so as to prevent any change in the counter output.

References Cited

UNITED STATES PATENTS 3,230,358 1/1966 Davis et al. ----- 235—150.51X

ROY LAKE, Primary Examiner

J. B. MULLINS, Assistant Examiner

U.S. Cl. X.R.

235—150.51; 307—235, 236, 251; 328—165